US010966356B2

(12) United States Patent
Nozawa

(10) Patent No.: US 10,966,356 B2
(45) Date of Patent: Mar. 30, 2021

(54) ELECTRONIC APPARATUS

(71) Applicant: Sony Interactive Entertainment Inc., Tokyo (JP)

(72) Inventor: Tetsufumi Nozawa, Chiba (JP)

(73) Assignee: Sony Interactive Entertainment Inc., Tokyo (JP)

(*) Notice: Subject to any disclaimer, the term of this patent is extended or adjusted under 35 U.S.C. 154(b) by 45 days.

(21) Appl. No.: 16/082,197

(22) PCT Filed: Mar. 9, 2017

(86) PCT No.: PCT/JP2017/009458
§ 371 (c)(1),
(2) Date: Sep. 4, 2018

(87) PCT Pub. No.: WO2017/159531
PCT Pub. Date: Sep. 21, 2017

(65) Prior Publication Data
US 2019/0364703 A1     Nov. 28, 2019

(30) Foreign Application Priority Data
Mar. 16, 2016  (JP) .............................. JP2016-052289

(51) Int. Cl.
*H05K 7/00* (2006.01)
*H05K 9/00* (2006.01)
*H05K 1/18* (2006.01)

(52) U.S. Cl.
CPC ........... *H05K 9/0026* (2013.01); *H05K 1/181* (2013.01); *H05K 9/0039* (2013.01); *H05K 2201/10409* (2013.01)

(58) Field of Classification Search
CPC ......... H05K 1/181; H05K 2201/10409; H05K 9/0026; H05K 9/0033; H05K 9/0039
See application file for complete search history.

(56) References Cited

U.S. PATENT DOCUMENTS 5,566,055 A * 10/1996 Salvi, Jr. .............. H05K 9/0037
361/816
5,633,786 A *  5/1997 Matuszewski ....... H05K 9/0032
361/818
(Continued)

FOREIGN PATENT DOCUMENTS

CA      2192903 A1   11/1997
CN      1148787 A     4/1997
(Continued)

OTHER PUBLICATIONS

The first Office Action for corresponding CN Application No. 201780015956. 17 pages, dated May 27, 2019.
(Continued)

*Primary Examiner* — Yuriy Semenenko
(74) *Attorney, Agent, or Firm* — Matthew B. Dernier, Esq.

(57) ABSTRACT

Provided is an electronic apparatus including a printed board having on a front surface thereof a first region and a second region in each of which a circuit element is disposed, and a shield member formed by a single metal sheet and disposed such as to face the front surface of the printed board. The shield member has a first section that faces the first region and a second section that faces the second region, and at least a boundary section of the first section and the second section is electrically connected to a ground pattern of the printed board, the ground pattern being formed between the first region and the second region.

5 Claims, 7 Drawing Sheets

(56) References Cited

U.S. PATENT DOCUMENTS

| | | | | |
|---|---|---|---|---|
| 6,051,780 | A | * | 4/2000 | Fuhrmann ............ H05K 9/0016 |
| | | | | 174/366 |
| 6,462,436 | B1 | * | 10/2002 | Kay ........................ H04B 15/02 |
| | | | | 307/91 |
| 6,744,640 | B2 | * | 6/2004 | Reis ...................... H01L 23/552 |
| | | | | 361/818 |
| 7,326,862 | B2 | * | 2/2008 | Lionetta ................. H05K 9/003 |
| | | | | 174/370 |
| 7,969,748 | B2 | | 6/2011 | Niederkorn |
| 8,384,604 | B2 | | 2/2013 | Niederkorn |
| 8,558,121 | B2 | * | 10/2013 | Tamaki ................ H05K 9/0049 |
| | | | | 174/351 |
| 9,101,044 | B2 | * | 8/2015 | Shimamura ......... H01L 23/3121 |
| 2003/0193794 | A1 | | 10/2003 | Reis |
| 2004/0162841 | A1 | * | 8/2004 | Bernstein ............. G06F 16/289 |
| 2005/0162841 | A1 | * | 7/2005 | Ogatsu .................. H05K 3/284 |
| | | | | 361/816 |
| 2011/0226523 | A1 | * | 9/2011 | Tamaki ................ H05K 9/0049 |
| | | | | 174/377 |

FOREIGN PATENT DOCUMENTS

| | | | |
|---|---|---|---|
| CN | 1653878 | A | 8/2005 |
| CN | 1659942 | A | 8/2005 |
| CN | 102037714 | A | 4/2011 |
| CN | 102037799 | A | 4/2011 |
| EP | 2230892 | A1 | 9/2010 |
| JP | 60149165 | | 10/1985 |
| JP | 4176197 | | 6/1992 |
| JP | 679198 | | 11/1994 |
| JP | 06079198 | U * | 11/1994 |
| JP | 08102592 | A | 4/1996 |
| JP | 8222877 | | 8/1996 |
| JP | 09307260 | A | 11/1997 |
| JP | 09307260 | A * | 11/1997 |
| JP | 2000196278 | A | 7/2000 |
| JP | 2003188571 | A | 7/2003 |
| JP | 2005294627 | A | 10/2005 |
| JP | 2011198861 | A | 10/2011 |

OTHER PUBLICATIONS

Notification of Reasons for Refusal for corresponding JP Application No. 2018-505876, 8 pages, dated Oct. 8, 2019.

International Preliminary Report on Patentability and Written Opinion for corresponding PCT Application No. PCT/JP2017/009458, 14 pages, dated Sep. 27, 2018.

International Search Report for corresponding PCT Application No. PCT/JP2017/009458, 4 pages, dated May 30, 2017.

The Second Office Action for corresponding CN Application No. 201780015956.0, 17 pages, dated Jan. 22, 2020.

* cited by examiner

ELECTRONIC APPARATUS

TECHNICAL FIELD

The present invention relates to an electronic apparatus that incorporates a printed board having a plurality of circuit elements mounted thereon.

BACKGROUND ART

In general, an electronic apparatus incorporates a printed board on which a plurality of circuit elements are mounted. The circuit elements include those generating electromagnetic fields which constitute noises influencing operations of other circuit elements, radio communication and the like. In order to prevent propagation of such noises, covering the circuit element serving as a noise-generating source with a shield member formed by a metal sheet or the like has been practiced.

SUMMARY

Technical Problems

Among the circuit elements acting as noise-generating sources, those generating comparatively intense noises and those generating weak noises and the like are mixedly present. Therefore, in addition to covering the board as a whole with a shield, a more powerful antinoise measure may be needed for the circuit element that generates intense noises. However, if the shield is formed in a double structure by disposing a shield for the circuit element generating intense noise in addition to, and separately form, the shield covering the whole board, an increase in cost and an enlargement of the apparatus in size would be caused. In addition, where the individual circuit elements are covered with individual shields, also, the number of shield members is increased, and an increase in cost and an enlargement of the apparatus in size are similarly brought about.

The present invention has been made in consideration of the above-mentioned circumstances. Accordingly, one of objects of the present invention is to provide an electronic apparatus which is comparatively low in cost and in which propagation of noises generated by circuit elements on a printed board can be effectively restrained.

Solution to Problems

An electronic apparatus according to the present invention includes a printed board having on a front surface thereof a first region and a second region in each of which a circuit element is disposed, and a shield member formed by a single metal sheet and disposed such as to face the front surface of the printed board. The shield member has a first section that faces the first region and a second section that faces the second region, and at least a boundary section of the first section and the second section is electrically connected to a ground pattern of the printed board, the ground pattern being formed between the first region and the second region.

DESCRIPTION OF EMBODIMENT

Figure 1:
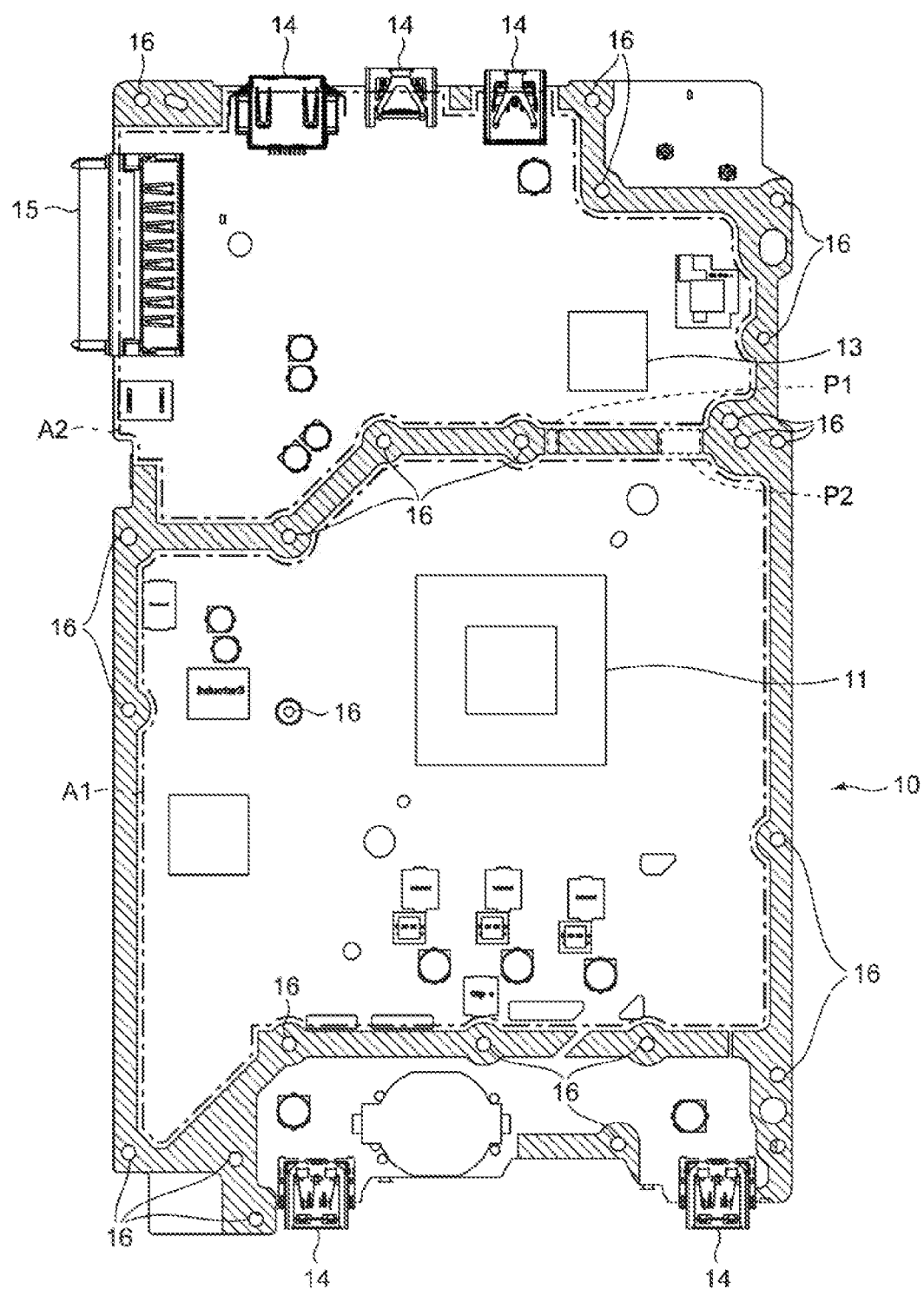
FIG. 1 is a plan view of a printed board incorporated in an electronic apparatus according to an embodiment of the present invention.

An embodiment of the present invention will be described in detail below, referring to the drawings.

An electronic apparatus according to one embodiment of the present invention is a home game machine, and is configured to include a printed board (printed wiring board) 10 on which various circuit elements are mounted, and a shield member for preventing propagation of noises generated on the printed board 10. Specifically, the electronic apparatus according to the present embodiment includes two shield members, namely, an upper shield member 20 disposed on a front surface (upper side) of the printed board 10, and a lower shield member 30 disposed on a back surface (lower side) of the printed board 10.

Figure 2:
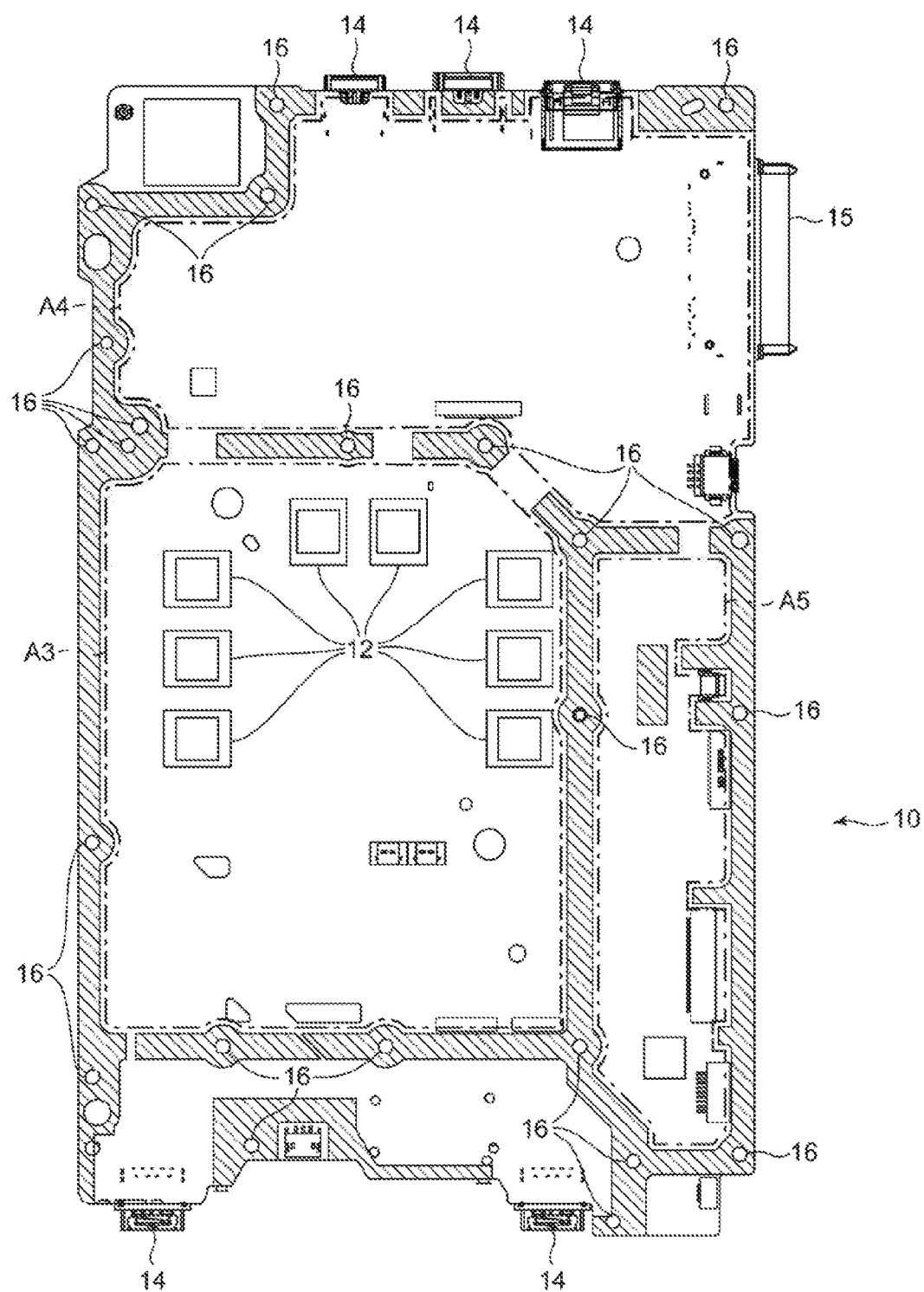
FIG. 2 is a bottom view of the printed board incorporated in the electronic apparatus according to the embodiment of the present invention.

FIG. 1 is a plan view depicting the appearance of the front surface of the printed board 10, and FIG. 2 is a bottom view depicting the appearance of a back surface of the printed board 10. As depicted in these figures, in the present embodiment, various circuit elements are individually disposed on the front surface and the back surface of the printed board 10. Specifically, a system-on-a-chip (SoC) 11 is disposed on the front surface of the printed board 10, whereas a plurality of memory elements 12 are disposed on the back surface. Other than these, an integrated circuit 13 is disposed on the front surface of the printed board 10. In addition, a plurality of connectors 14 serving as an interface for connection of the electronic apparatus to external apparatuses are disposed at an outer peripheral portion of the printed board 10. Further, an incorporated-apparatus connector 15 for connecting a peripheral apparatus incorporated in the electronic apparatus is also mounted. Note that though description is omitted here, other various circuit elements than these are mounted on the printed board 10.

The SoC 11 is an integrated circuit that executes central processing for realizing the functions of the electronic apparatus according to the present embodiment. In the present embodiment, the SoC 11 performs not only general information processing but also image drawing processing. The memory elements 12 are semiconductor elements that store data to be processed by the SoC 11. Here, the memory elements 12 are assumed to be memory chips according to the standard of graphics double data rate (GDDR). In the present embodiment, among the various circuit elements mounted on the printed board 10, the SoC 11 and the memory elements 12 generate comparatively strong noises. Therefore, an antinoise measure should be provided, in order that the noises will not exert bad influences on other circuit elements or the like.

The integrated circuit 13 executes processing related to interface control and the like. As compared to the SoC 11 and the memory elements 12, the integrated circuit 13 generate a weak noise. However, the noise may also influence radio communication and the like performed by the electronic apparatus, and, therefore, an antinoise measure is desirably provided. The plurality of connectors 14 are interfaces for wired communication connection of the electronic apparatus to external apparatuses, and may be connectors according to such standards as universal serial bus (USB), high-definition multimedia interface (HDMI) (registered trademark), and Ethernet (registered trademark). The incorporated-apparatus connector 15 is an interface for connection of a hard disk drive incorporated in the electronic apparatus.

On the front surface and the back surface of the printed board 10, a ground pattern providing a reference potential for the electronic circuit on the printed board 10 is formed. In FIGS. 1 and 2, the ground pattern is indicated by hatching. In the present embodiment, the front surface and the back surface of the printed board 10 are each divided into a plurality of areas by the ground pattern. Specifically, an area A1 and an area A2 are formed on the front surface of the printed board 10. The SoC 11 is disposed in the area A1, whereas the integrated circuit 13, some of the connectors 14, and the incorporated-apparatus connector 15 are disposed in the area A2. In addition, an area A3, an area A4, and an area A5 are formed on the back surface of the printed board 10. Eight memory elements 12 are disposed in the area A3, and various circuit elements are disposed also in the areas A4 and A5.

In the present embodiment, for each of the plurality of areas, an antinoise measure for such a control as to prevent noises generated in the area from being propagated to the outside of the area is realized. Such an antinoise measure is realized by the upper shield member 20 and the lower shield member 30. Both the upper shield member 20 and the lower shield member 30 are produced by forming conductive metal sheets, and have a plurality of recessed portions. Each of these shield members can be produced by subjecting a single metal sheet to forming, such as drawing.

Figure 3:
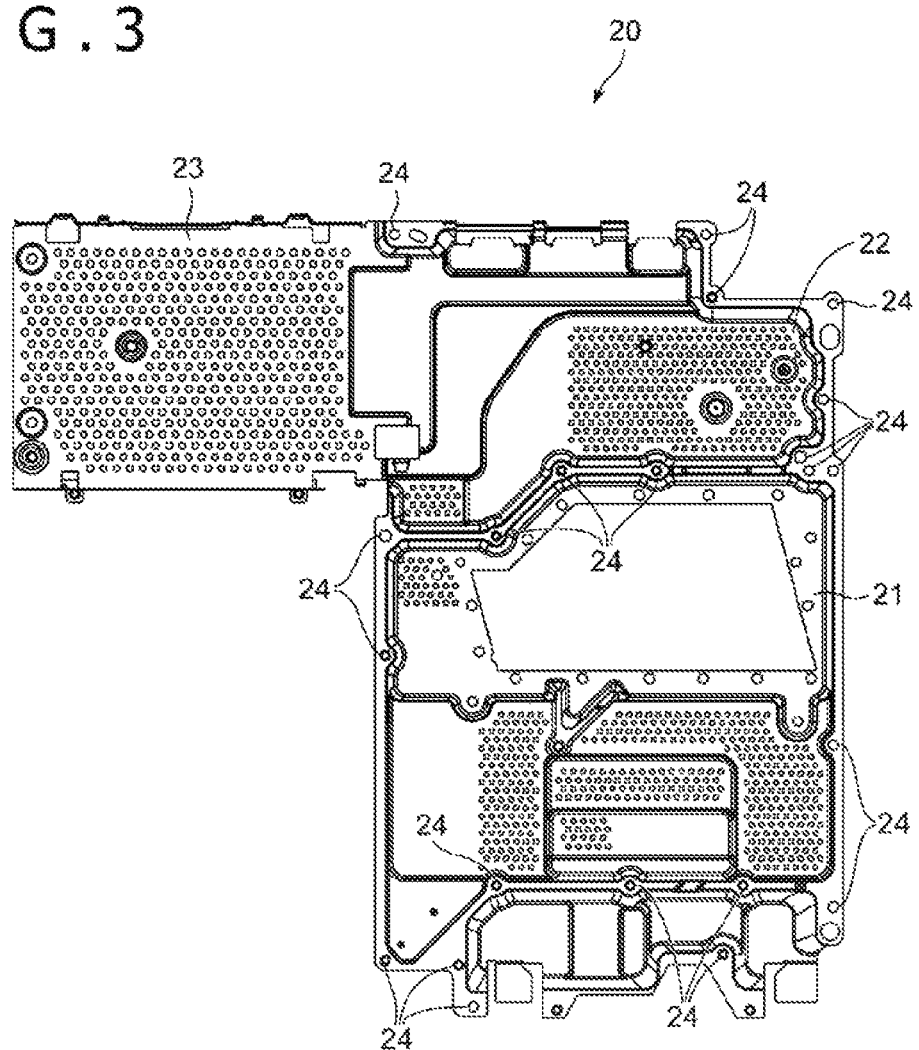
FIG. 3 is a plan view of an upper shield member.
Figure 4:
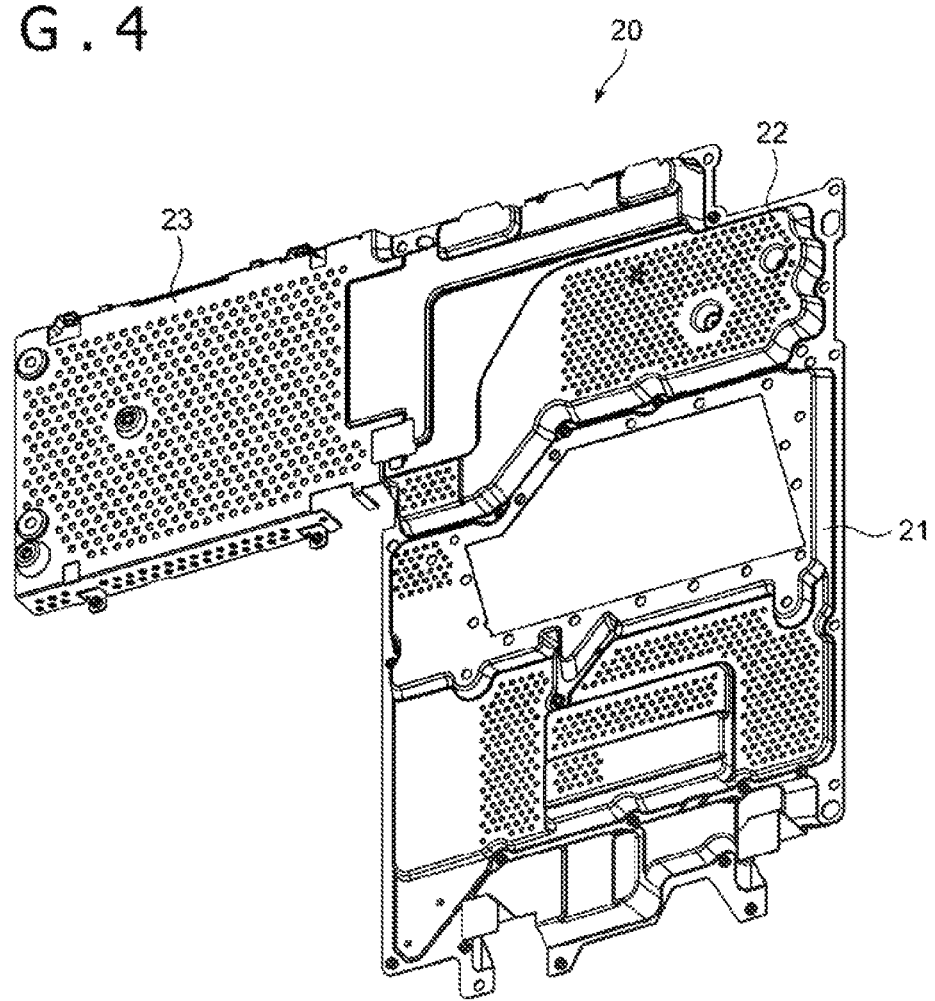
FIG. 4 is a perspective view of the upper shield member.

FIG. 3 is a plan view depicting a surface, on the side opposite to a surface facing the printed board 10, of the upper shield member 20, and FIG. 4 is a perspective view as viewed from above. The upper shield member 20 is disposed such as to face the front surface of the printed board 10. As depicted in these figures, the upper shield member 20 has a first section 21, a second section 22, and a non-facing section 23. In both the first section 21 and the second section 22, the surfaces facing the printed board 10 are formed in substantially recessed shapes. When the upper shield member 20 is mounted to the printed board 10, the first section 21 faces the area A1 of the printed board 10, and the second section 22 faces the area A2. The recessed portions formed in the first section 21 and the second section 22 form spaces between themselves and the front surface of the printed board 10, such that the circuit elements disposed in the area A1 and the area A2 can be accommodated in the respective spaces. In addition, the non-facing section 23 is a section that does not face the printed board 10, and functions as a case for accommodating the hard disk drive connected to the printed board 10.

The first section 21 covers the area A1 in which the SoC 11 and other circuit elements are disposed, whereby noises generated from these circuit elements and through-holes in the area A1 and the like are restrained from being propagated to the exterior. Similarly, the second section 22 covers the area A2, whereby noises generated from circuit elements such as the integrated circuit 13 disposed in the area A2 and through-holes in the area A2 and the like are restrained from being propagated to the exterior. Note that the principle of noise propagation prevention in the present embodiment will be described later.

Figure 5:
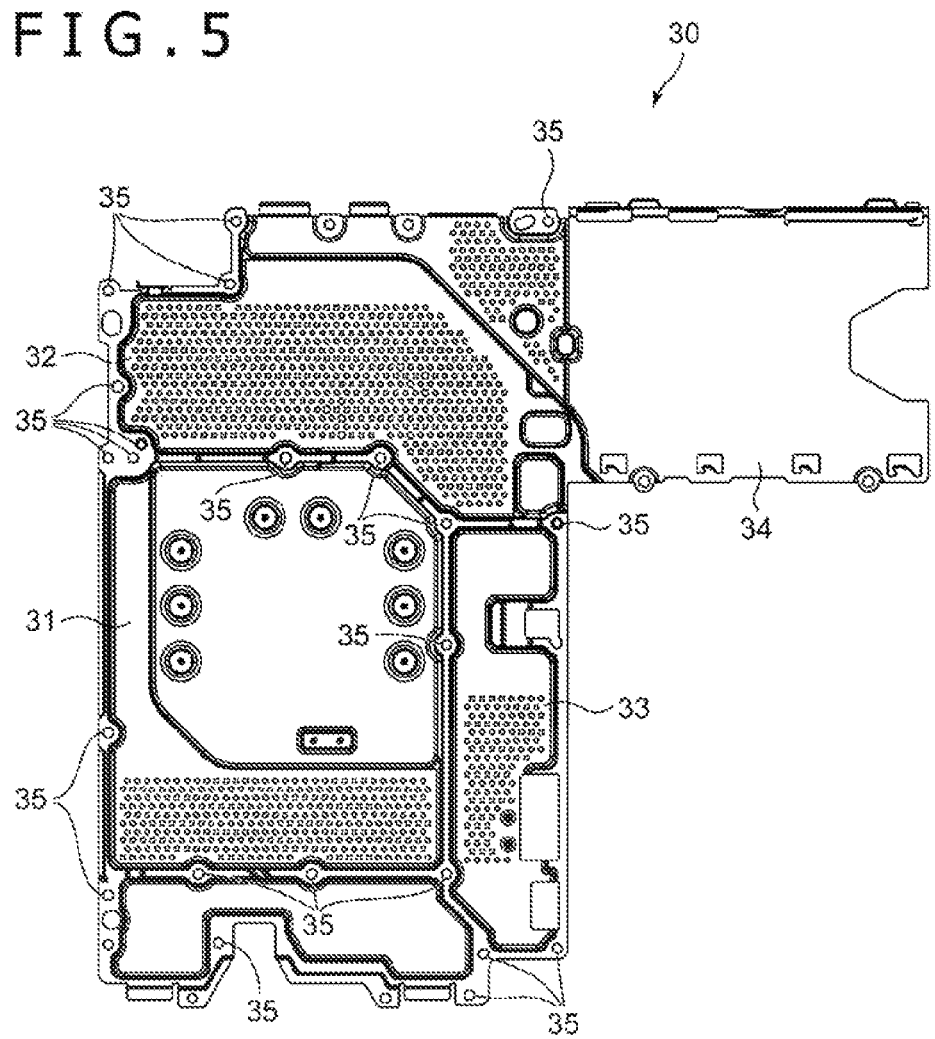
FIG. 5 is a bottom view of a lower shield member.
Figure 6:
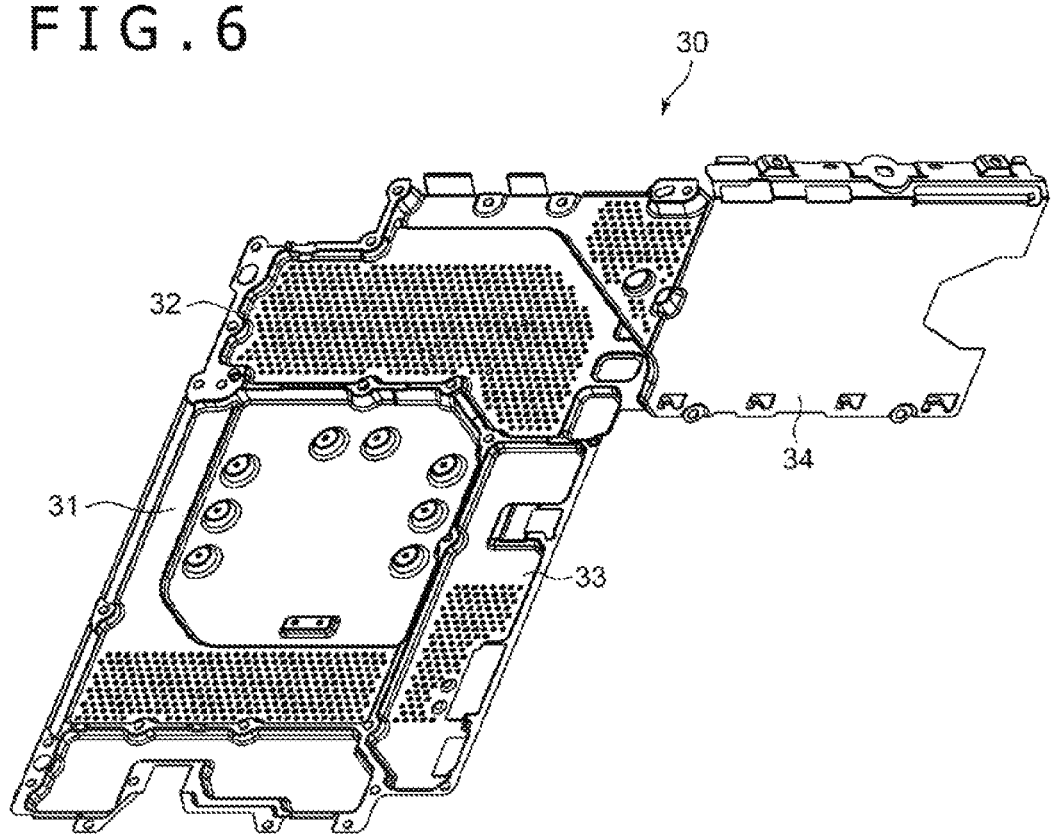
FIG. 6 is a perspective view of the lower shield member.

FIG. 5 is a bottom view depicting a surface, on the side opposite to a surface facing the printed board 10, of the lower shield member 30, and FIG. 6 is a perspective view as viewed from below. The lower shield member 30 is disposed such as to face the back surface of the printed board 10. As depicted in these figures, the lower shield member 30 has a third section 31, a fourth section 32, a fifth section 33, and a non-facing section 34. Of all the third section 31, the fourth section 32 and the fifth section 33, the surfaces facing the printed board 10 are formed in substantially recessed shapes. When the lower shield member 30 is mounted to the printed board 10, the third section 31 faces the area A3 of the printed board 10, the fourth section 32 faces the area A4, and the fifth section 33 faces the area A5. The recessed portions formed in the third section 31, the fourth section 32, and the fifth section 33 form spaces between themselves and the back surface of the printed board 10, such that circuit elements disposed in the area A3, the area A4, and the area A5 can be accommodated in the respective spaces. In addition, the non-facing section 34 is a section that does not face the printed board 10, and cooperates with the non-facing section 23 of the upper shield member 20 in accommodating the hard disk drive.

The third section 31 covers the area A3 in which the plurality of memory elements 12 and other circuit elements are disposed, whereby noises generated from these circuit elements and the like are restrained from being propagated to the exterior. Similarly, the fourth section 32 covers the area A4, and the fifth section 33 covers the area A5, to restrain noises generated in the inside of the areas from being propagated to the exterior.

Figure 7:
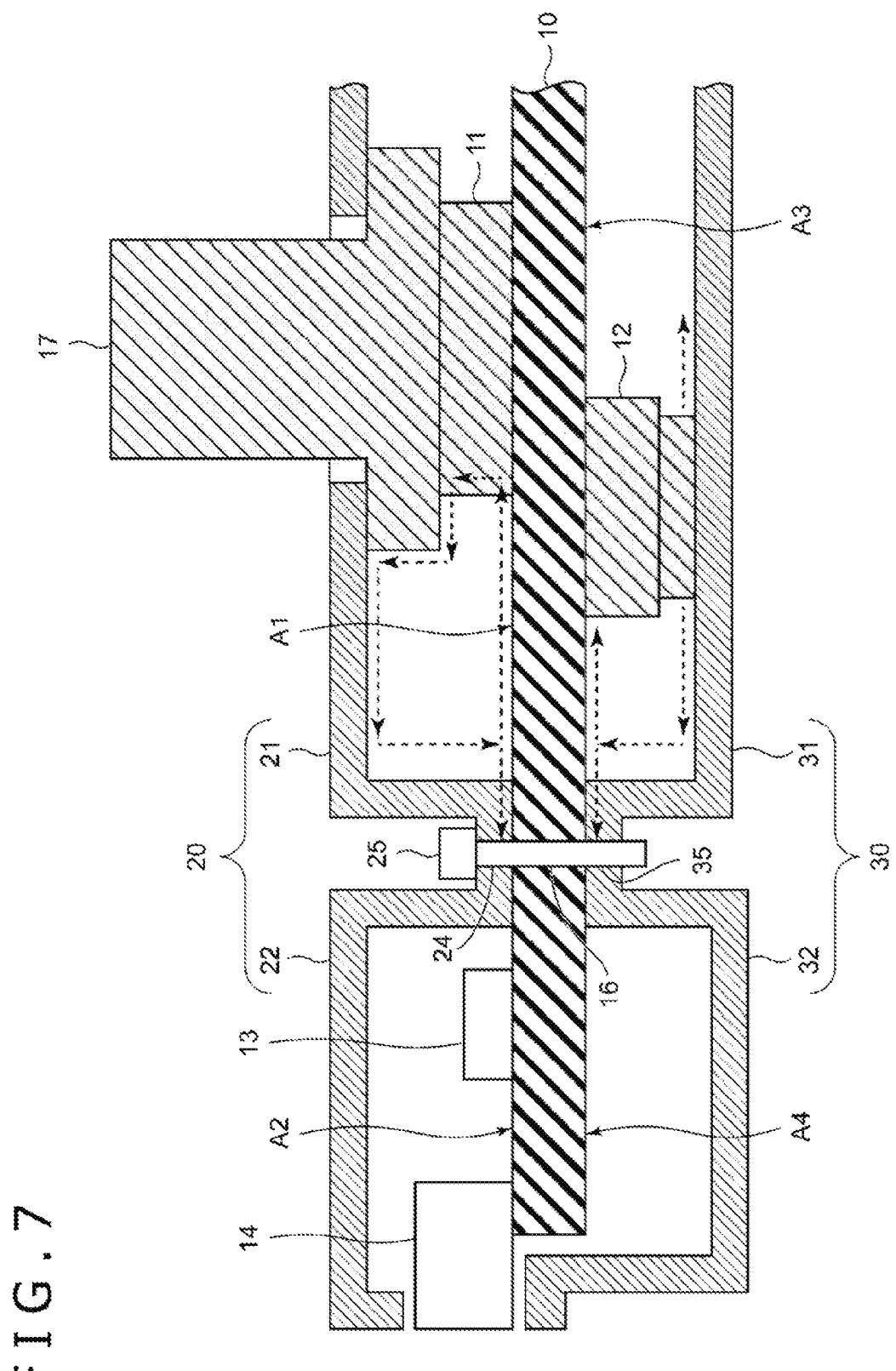
FIG. 7 is a figure for explaining the principle of noise propagation prevention in the embodiment of the present invention.

The principle of noise propagation prevention in the present embodiment will be described below, referring to FIG. 7. FIG. 7 is a partly sectional view depicting schematically a situation in which the printed board 10 with the upper shield member 20 and the lower shield member 30 fixed thereto is cut in a direction perpendicular to the surfaces thereof. Note that for convenience, FIG. 7 depicts only essential parts, and the size and position of each part are different from the actual ones.

As depicted in FIG. 7, the upper shield member 20 is electrically connected to the ground pattern of the printed board 10, along the boundary section of the first section 21 and the second section 22 (namely, along the section surrounded by the first section 21 and the second section 22). More specifically, as depicted in FIGS. 1 and 2, the ground pattern of the printed board 10 is formed therein with a plurality of tapped holes 16. In addition, as depicted in FIG. 3, a plurality of tapped holes 24 are provided along outer peripheral portions surrounding individually the first section 21 and the second section 22 (namely, along portions projecting to the printed board 10 side to form edges of the recessed portions), of the upper shield member 20. As exemplified in FIG. 7, the upper shield member 20 is fastened to the printed board 10 by screws 25, through the tapped holes 24 in the upper shield member 20 and the tapped holes 16 in the printed board 10. By this, the upper shield member 20 is fixed to the printed board 10, and the outer peripheral portions of the first section 21 and the second section 22 are electrically connected to the ground pattern of the printed board 10.

Especially, the boundary section of the first section 21 and the second section 22 is electrically connected to the ground pattern disposed between the area A1 and the area A2 of the printed board 10. By this, as indicated by broken-line arrows in FIG. 7, noises generated from the SoC 11 and the like are shielded at the position of connection to the ground pattern.

Thus, in the electronic apparatus according to the present embodiment, notwithstanding the first section 21 and the second section 22 are formed by the same single metal sheet, noises can be restrained from being propagated mutually between the first section 21 and the second section 22. In other words, with only the upper shield member 20 formed by the single metal sheet, antinoise measures can be individually realized for the area A1 and the area A2.

As aforementioned, in the present embodiment, particularly the noises generated by the SoC 11 in the area A1 are comparatively intense, and the noises generated by the circuit elements such as the integrated circuit 13 in the area A2 are comparatively weak. Therefore, a difference in the noise restraining ability required is present between the first section 21 and the second section 22. Specifically, since the first section 21 is required to have a comparatively high noise restraining ability, it is desirable not to provide a large hole in the first section 21. Note that a large opening exists in the first section 21 as depicted in FIG. 3, but this opening is for disposing the heat sink 17 for cooling the SoC 11, and the opening is closed by the heat sink 17 as depicted in FIG. 7.

On the other hand, the second section 22 is not required to have a noise restraining ability so high as that of the first section 21. For this reason, the second section 22 need not have a structure for perfectly covering the circuit elements in the area A2, and is permitted to be provided with a hole not smaller than a predetermined size. In addition, since the plurality of connectors 14 and the incorporated-apparatus connector 15 are disposed in the area A2, side surfaces of the second section 22 are opening at the positions where these connectors are disposed, so that a perfect recessed portion is not formed in the second section 22 as a whole. A design wherein such an opening is provided can be adopted, since the first section 21 and the second section 22 restrain noise propagation individually. Thus, according to the electronic apparatus of the present embodiment, the level of antinoise measure can be set to be different on the basis of each area serving as a unit of antinoise measure.

Note that on a circuit design basis, it is impossible to perfectly separate the area A1 and the area A2 from each other by the ground pattern, and pattern wirings that connect the circuit elements in the area A1 with the circuit elements in the area A2 are needed. Specifically, as depicted in FIG. 1, the ground pattern breaks off at positions P1 and P2, and the area A1 and the area A2 are connected by pattern wirings extending through the positions P1 and P2. Therefore, the positions P1 and P2 may constitute routes for propagation of noises. In view of this, the tapped holes 16 may be provided at those positions in the ground pattern which are as close as possible to the positions P1 and P2, to connect the upper shield member 20 to the ground pattern at those positions, whereby noise propagation can be restrained. In addition, it is preferable to provide the tapped holes 16 on both sides of each of the positions P1 and P2, and thereby to connect the upper shield member 20 to the ground pattern on both sides.

In regard of the lower shield member 30, also, as depicted in FIG. 5, outer peripheral portions surrounding individually the third section 31, the fourth section 32, and the fifth section 33 are provided with tapped holes 35. As depicted in FIG. 7, the lower shield member 30 is fastened to the printed board 10 by screws 25 through these tapped holes 35 and the tapped holes 16 provided in the ground pattern of the printed board 10. By this, the lower shield member 30 is fixed to the printed board 10, and the respective outer peripheral portions of the third section 31, the fourth section 32, and the fifth section 33 are electrically connected to the ground pattern of the printed board 10. Particularly, the boundary section of the third section 31 and the other section is electrically connected to the ground pattern of the printed board 10, whereby noises generated from the memory elements 12 and the like disposed in the third section 31 can be restrained from being propagated to the other part. In addition, with respect to both the fourth section 32 and the fifth section 33, also, noises generated in the inside thereof can be restrained from being propagated to the exterior. In short, with only the lower shield member 30 formed by a single metal sheet, antinoise measures can be individually realized for the area A3, the area A4, and the area A5.

On the back surface of the printed board 10, also, noises generated from the memory elements 12 in the area A3 are comparatively intense, whereas noises generated in the other regions are comparatively weak. Therefore, a design can be adopted which ensures that the third section 31 facing the area A3 is high in noise restraining ability, while the other sections are comparatively weak in noise restraining ability.

Note that as clearly seen from FIGS. 1 and 2, the ground pattern on the front surface of the printed board 10 and the ground pattern on the back side have their positions coincident with each other (that is, the ground patterns are present at the same position on the front side and the back side) in a partial region or regions, but there are also regions in which the ground pattern is formed on only one side. As a result, there are differences between the front side and the back side in the number and shape of the areas serving as units of antinoise measure. Thus, the number and shape of the areas may be set different between the front surface and the back surface of the printed board 10, depending on the convenience of circuit layout design on the printed board 10 and the like factors.

On the other hand, in the region in which the ground pattern on the front surface and that on the back surface overlap with each other, the upper shield member 20 and the lower shield member 30 can be co-fastened by one screw 25, as depicted in FIG. 7. Specifically, the boundary section of the first section 21 and the second section 22 of the upper shield member 20, the ground pattern between the area A1 and the area A2 of the front surface of the printed board 10, the ground pattern between the third area A3 and the fourth area A4 of the back surface of the printed board 10, and the boundary section of the third section 31 and the fourth section 32 of the lower shield member 30 have overlapping regions which wholly overlap with one another in plan view. Such overlapping regions of the upper shield member 20, the printed board 10, and the lower shield member 30 are individually provided with tapped holes, and all the members are co-fastened by one screw 25. By this, both the upper shield member 20 and the lower shield member 30 can be electrically connected to the ground pattern of the printed board 10 by the one screw 25. Where the number of positions at which such co-fastening is possible is increased, electrical connection of the upper shield member 20 and the lower shield member 30 to the printed board 10 can thereby be realized by a reduced number of screws. Note that depending on positions, only the upper shield member 20 and the lower shield member 30 may be screw-fastened, without the printed board 10 interposed therebetween.

As has been described above, according to the electronic apparatus of the present embodiment, antinoise measure can be independently applied to a plurality of areas on the surface of the printed board 10, by a single shield member formed by a single metal sheet. In addition, the level of antinoise measure can be set to be different on the basis of each area. Therefore, the number of parts can be reduced and the assembling process can be simplified, as compared to the case where antinoise measures are applied to the areas by separate shield members. In addition, the manufacturing cost can be lowered. Further, as compared to the case where the shield is formed in a double structure, the overall thickness of the printed board with the shield fixed thereto can be reduced, and, therefore, the electronic apparatus as a whole can be reduced in size and weight. Besides, where one sheet of shield member is finely partitioned on an area basis by drawing or the like, the strength of the shield member can thereby be enhanced, and parts such as the SoC 11 accommodated in the partitions can thereby be protected from impact or exfoliation.

Note that the embodiment of the present invention is not limited to the above-described. For example, the kind, number, layout positions and the like of the circuit elements mounted on the printed board 10 are not restricted to the above-described ones. Similarly, the number and shape of the areas serving as units of antinoise measure are not limited to the above-described, and various numbers and shapes may be adopted. In addition, while the method for electrically connecting the upper shield member 20 and the lower shield member 30 to the ground pattern of the printed board 10 has been fastening with the screws through the tapped holes formed in the ground patterns in the above-described embodiment, each of the shield members may be fastened to the printed board 10 by other fastening members. Besides, electrical connection may be carried out by other methods.

In addition, while the electronic apparatus has been a home game machine in the above-described embodiment, the electronic apparatus according to an embodiment of the present invention is not limited to this. The electronic apparatus may be any of various apparatuses incorporating a printed board on which circuit elements generating noises are mounted, such as, for example, personal computers, portable game machines, and smart phones.

REFERENCE SIGNS LIST

10 . . . Printed board, 11 . . . SoC, 12 . . . Memory element, 13 . . . Integrated circuit, 14 . . . Connector, 15 . . . Incorporated-apparatus connector, 16 . . . Tapped hole, 17 . . . Heat sink, 20 . . . Upper shield member, 21 . . . First section, 22 . . . Second section, 23 . . . Non-facing section, 24 . . . Tapped hole, 25 . . . Screw, 30 . . . Lower shield member, 31 . . . Third section, 32 . . . Fourth section, 33 . . . Fifth section, 34 . . . Non-facing section, 35 . . . Tapped hole.

The invention claimed is:

1. An electronic apparatus comprising:
a printed board having on a front surface thereof a first region and a second region in which circuit elements are individually disposed; and
a shield member formed by a single metal sheet and disposed such as to face the front surface of the printed board,
wherein the shield member has a first section that faces the first region and a second section that faces the second region, and at least a boundary section of the first section and the second section is electrically connected to a ground pattern of the printed board, the ground pattern formed between the first region and the second region; wherein each section of the shield member has an anti-noise feature with a respective dimension that determines a level of noise reduction of the shield member section, the anti-noise feature of each section including a respective hole in the metal sheet;

the dimension of the hole of the first section is different than the dimension of the hole of the second section; and at at least one break in the ground pattern such that the break connects the first and second regions, the boundary section is electrically connected to the ground pattern on both sides of the break.

2. The electronic apparatus according to claim 1, wherein, of the first section, a surface facing the printed board is formed in a recessed shape, and an outer peripheral portion thereof is electrically connected to the ground pattern of the printed board.

3. The electronic apparatus according to claim 1, wherein the shield member is fastened to the printed board by a screw through a tapped hole provided in the boundary section, thereby being electrically connected to the ground pattern of the printed board.

4. The electronic apparatus according to claim 3, wherein the printed board has on a back surface thereof a third region and a fourth region in which circuit elements are individually disposed, the electronic apparatus further comprises a second shield member formed by a single metal sheet and disposed such as to face the back surface of the printed board, and the second shield member has a third section that faces the third region and a fourth section that faces the fourth section, and at least a boundary section of the third section and the fourth section is electrically connected to a ground pattern of the printed board, the ground pattern formed between the third region and the fourth region.

5. The electronic apparatus according to claim 4, wherein the ground pattern formed between the first region and the second region and the ground pattern formed between the third region and the fourth region have a region in which they overlap with each other in plan view, and in the overlapping region, the screw electrically connects both the boundary section of the first region and the second region of the shield member and the boundary section between the third region and the fourth region of the second shield member to the ground pattern of the printed board.

* * * * *